United States Patent
Doberstein

(10) Patent No.: US 9,749,122 B2
(45) Date of Patent: Aug. 29, 2017

(54) METHOD OF SYNCHRONIZING A FOUNTAIN CODE TRANSMITTING END AND RECEIVING END

(71) Applicant: MOTOROLA SOLUTIONS, INC., Schaumburg, IL (US)

(72) Inventor: Kevin G. Doberstein, Elmhurst, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 119 days.

(21) Appl. No.: 14/865,788

(22) Filed: Sep. 25, 2015

(65) Prior Publication Data
US 2017/0093557 A1    Mar. 30, 2017

(51) Int. Cl.
*H04J 3/06* (2006.01)
*H04L 7/00* (2006.01)
(Continued)

(52) U.S. Cl.
CPC ........ *H04L 7/0008* (2013.01); *H03M 13/154* (2013.01); *H04L 1/0041* (2013.01); *H04L 1/0045* (2013.01)

(58) Field of Classification Search
CPC ... H04L 7/0008; H04L 1/0045; H04L 1/0041; H03M 13/154
See application file for complete search history.

(56) References Cited

U.S. PATENT DOCUMENTS

| 4,667,301 A | 5/1987 | Chiu et al. |
| 2004/0019619 A1 | 1/2004 | Buer et al. |

(Continued)

FOREIGN PATENT DOCUMENTS

| GB | 1597700 | 9/1981 |
| WO | 2005/036753 | 4/2005 |

OTHER PUBLICATIONS

Luby, "LT Codes, Proceedings of the 43rd Annual IEEE Symposium on Foundations of Computer Science FOCS '02," Digital Fountain, Inc. (2002).
(Continued)

*Primary Examiner* — Afshawn Towfighi
(74) *Attorney, Agent, or Firm* — Michael Best & Friedrich LLP

(57) ABSTRACT

Systems and methods of synchronizing a fountain code transmitting end and receiving end. In one embodiment, the fountain code transmitting end includes a first pseudorandom number generator, a second pseudorandom number generator, and a first transceiver. The method includes generating, at the first pseudorandom number generator, a first random number based on a seed. The method further includes generating, at the second pseudorandom number generator, a first plurality of unique random numbers based on the first random number. The method also includes selecting, at the fountain code transmitting end, a first subset of data blocks of a plurality of data blocks based on the first plurality of unique random numbers. The method further includes generating, at the fountain code transmitting end, a first communication block based on the first subset of data blocks. The method also includes transmitting, via the first transceiver, the first communication block and the seed.

20 Claims, 7 Drawing Sheets

(51) Int. Cl.
  *H03M 13/15*  (2006.01)
  *H04L 1/00*  (2006.01)

(56) References Cited

U.S. PATENT DOCUMENTS

| | | | |
|---|---|---|---|
| 2004/0230406 A1 | 11/2004 | Yamamoto et al. | |
| 2010/0153478 A1* | 6/2010 | Aliseychik | G06F 7/58 708/255 |
| 2011/0084796 A1* | 4/2011 | Savry | G06K 7/10257 340/5.8 |
| 2016/0154970 A1* | 6/2016 | Calmon | H04L 9/06 713/165 |

OTHER PUBLICATIONS

First Office Action from the Intellectual Property Office of Australia for Application No. 2016231603 dated Apr. 19, 2017 (5 pages).

* cited by examiner

US 9,749,122 B2

METHOD OF SYNCHRONIZING A FOUNTAIN CODE TRANSMITTING END AND RECEIVING END

BACKGROUND OF THE INVENTION

Fountain codes (for example, Luby Transform (LT) codes, raptor codes, and online codes) are a class of erasure codes that do not exhibit a fixed code rate. Fountain codes can be used in an encoding scheme to help control errors in data transmission over noisy communication channels.

Communication systems that use fountain codes include an encoder and a decoder. The encoder encodes data blocks into communication blocks using a pseudorandom number generator. The encoder transmits the communication blocks to the decoder over a communication channel. The decoder decodes the received communication blocks using a pseudorandom number generator. The pseudorandom number generators in the encoder and decoder require synchronization.

Accordingly, there is a need for synchronizing a fountain code transmitting end and receiving end.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
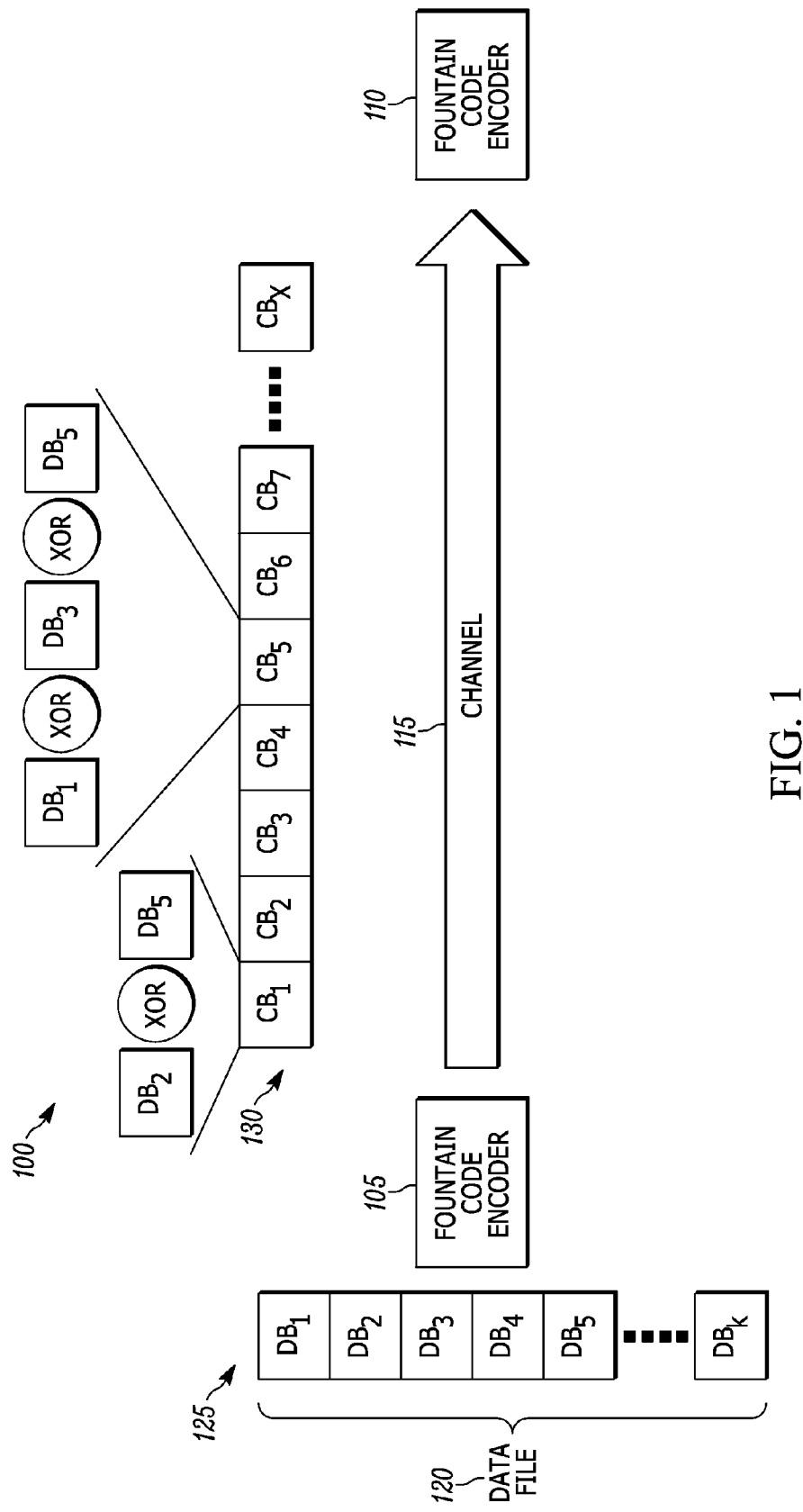
FIG. 1 is a diagram of a communication system.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

An example of a system that uses fountain codes is illustrated in FIG. 1 in the form of a communication system 100. The communication system 100 includes a fountain code encoder 105, a fountain code decoder 110, a channel 115, and a data file 120. The fountain code encoder 105 segments the data file 120 into a plurality of data blocks 125 (for example, k data blocks). The fountain code encoder 105 generates a plurality of communication blocks 130 (for example, x communication blocks) using a pseudorandom number generator. The fountain code encoder 105 selects at random a degree d, $1 \leq d \leq k$ for each communication packet 130. The fountain code encoder 105 randomly selects exactly d unique data blocks 125 from the data file 120. The fountain code encoder 105 combines the selected d data blocks 125 (for example, using an exclusive-or (XOR) operation) to form the communication blocks 130. For example, a first communication block ($CB_1$) in FIG. 1 is the bit-wise XOR combination of a second data block ($DB_2$) and a fifth data block ($DB_5$). Also, for example, a fifth communication block ($CB_5$) in FIG. 1 is the bit-wise XOR combination of a first data block ($DB_1$), a third data block ($DB_3$), and the fifth data block ($DB_5$).

The fountain code encoder 105 transmits the communication blocks 130 to the fountain code decoder 110 via the channel 115. The fountain code encoder 105 appends a cyclic redundancy check (CRC) over the communication block 130 and may optionally encode the communication block 130 with a forward error correction code (for example, a convolutional code) prior to transmitting it over the channel 115. The fountain code decoder 110 first performs appropriate forward error correction decoding (for example, convolutional decoding) if this optional encoding was applied in the fountain code encoder 105. Then, the fountain code decoder 110 determines the validity of each received communication block 130, for example, by computing a cyclic redundancy check over the block and comparing it to the transmitted cyclic redundancy check and discards errored communication blocks 130. The fountain code decoder 110 identifies the data blocks 125 that are included in each valid communication block 130 using a pseudorandom number generator. For each communication block 130, the pseudorandom number generator in the fountain code decoder 110 draws one random number to determine the degree d and then subsequently draws d unique random numbers which represent the numbers of the data blocks 125 included in the communication block 130. Eventually, the fountain code decoder 110 receives enough valid communication blocks 130 to construct the data file 120.

The pseudorandom number generators in the fountain code decoder and encoder 105 and 110 require synchronization. In some communication systems, the fountain code encoder 105 transmits a synchronization pattern (for example, a seed value used to generate a sequence of random numbers) along with each communication block 130 to the fountain code decoder 110 to maintain synchronization. The fountain code encoder 105 may also transmit a synchronization pattern (for example, an intermediate seed value from the generation of the sequence of random numbers) periodically to allow decoders that may have missed the initial synchronization sequence to synchronization to the encoded stream. Difficulties arise in the fountain code decoder 110 when a synchronization pattern is not included in each communication block 130. The fountain code decoder 110 needs to execute the random number draws for each communication block 130 created by the fountain code encoder 105 to maintain synchronization with the fountain code encoder 105. This includes executing random number draws for missing or errored communication blocks.

Using two different pseudorandom number generators that are linked together enables a fountain code receiving end to maintain synchronization with a fountain code transmitting end while eliminating the need for every communication block to include a synchronization pattern and the need for the fountain code receiving end to perform random number draws for missing or errored communication blocks.

Some exemplary embodiments include a method of synchronizing a fountain code transmitting end and a fountain code receiving end. In one embodiment, the fountain code transmitting end includes a first pseudorandom number generator, a second pseudorandom number generator, and a first transceiver. The method includes generating, at the first pseudorandom number generator, a first random number based on a seed. The method further includes generating, at the second pseudorandom number generator, a first plurality of unique random numbers based on the first random number. The method also includes selecting, at the fountain code transmitting end, a first subset of data blocks of a plurality of data blocks based on the first plurality of unique random numbers. The method further includes generating, at the fountain code transmitting end, a first communication block based on the first subset of data blocks. The method also includes transmitting, via the first transceiver, the first communication block and the seed.

In one embodiment, the fountain code receiving end includes a third pseudorandom number generator, a fourth pseudorandom number generator, and a second transceiver. In some embodiments, the method further includes receiving, via the second transceiver, the first communication block and the seed. The method also includes generating, at the third pseudorandom number generator, the first random number based on the seed. The method further includes generating, at the fourth pseudorandom number generator, the first plurality of unique random numbers based on the first random number. The method also includes identifying, at the fountain code receiving end, the first subset of data blocks included in the first communication block based on the first plurality of unique random numbers.

Other exemplary embodiments include a fountain code communication system for communicating a data file. The data file includes a plurality of data blocks. The fountain code system includes fountain code transmitting end. In one embodiment, the fountain code transmitting end includes a first pseudorandom number generator, a second pseudorandom number generator, and a first transceiver. The first pseudorandom number generator generates a first random number based on a seed. The second pseudorandom number generator generates a first plurality of unique random numbers based on the first random number. The fountain code transmitting end selects a first subset of data blocks of the plurality of data blocks based on the first plurality of unique random numbers. The fountain code transmitting end also generates a first communication block based on the first subset of data blocks. The first transceiver transmits the first communication block and the seed.

Systems such as the ones described herein may be used, for example, to distribute large data files, such as a firmware upgrade file, an image file, or other large data file, in wireless communication systems with a large number of communication devices (for example, radios or cellular telephones).

In some embodiments, the fountain code system also includes a fountain code receiving end. In one embodiment, the fountain code receiving end includes a second transceiver, a third pseudorandom number generator, and a fourth pseudorandom number generator. The second transceiver receives the first communication block and the seed. The third pseudorandom number generator generates the first random number based on the seed. The fourth pseudorandom number generator generates the first plurality of unique random numbers based on the first random number. The fountain code receiving end identifies the first subset of data blocks included in the first communication block based on the first plurality of unique random numbers.

Figure 2:
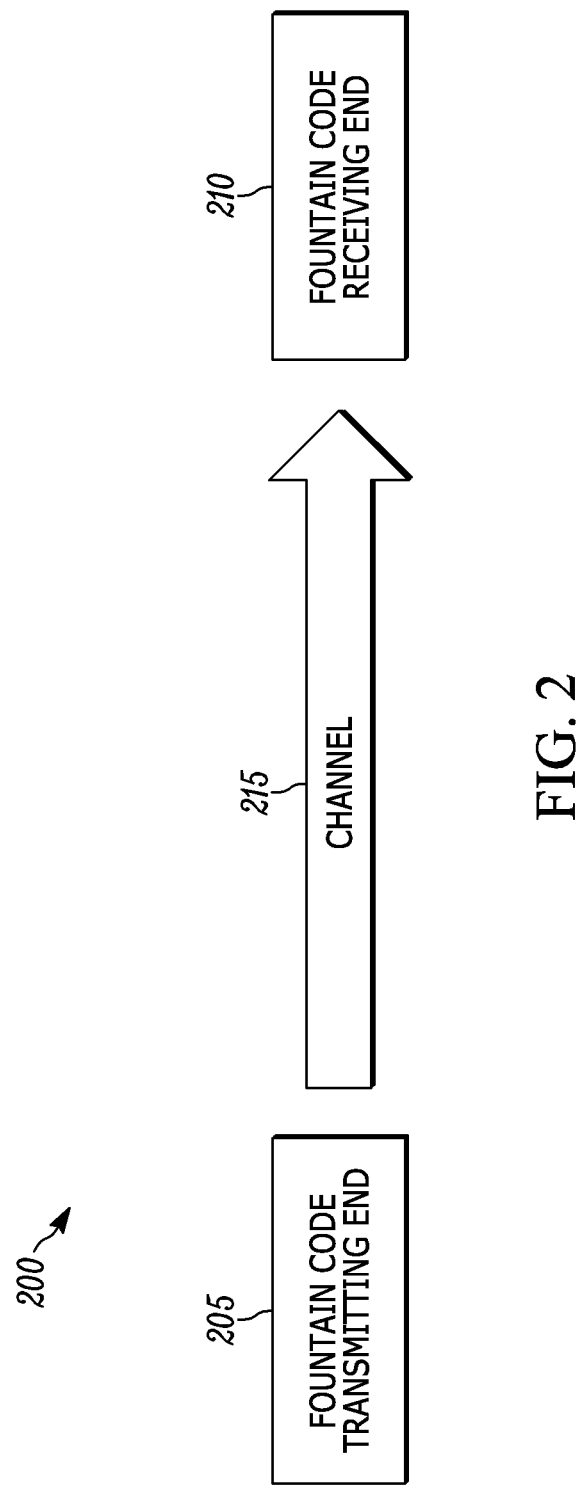
FIG. 2 is a block diagram of a fountain code system, in accordance with some embodiments.

FIG. 2 is a fountain code system 200, in accordance with some embodiments. In the embodiment illustrated in FIG. 2, the fountain code system 200 includes a fountain code transmitting end 205 and a fountain code receiving end 210. In the example illustrated, the fountain code transmitting end 205 encodes the data file 120 into communication blocks 130 and transmits them to the fountain code receiving end 210 via a channel 215 (for example, a radio-frequency channel). The fountain code receiving end 210 decodes the communication blocks 130 to construct the data file 120.

Figure 3:
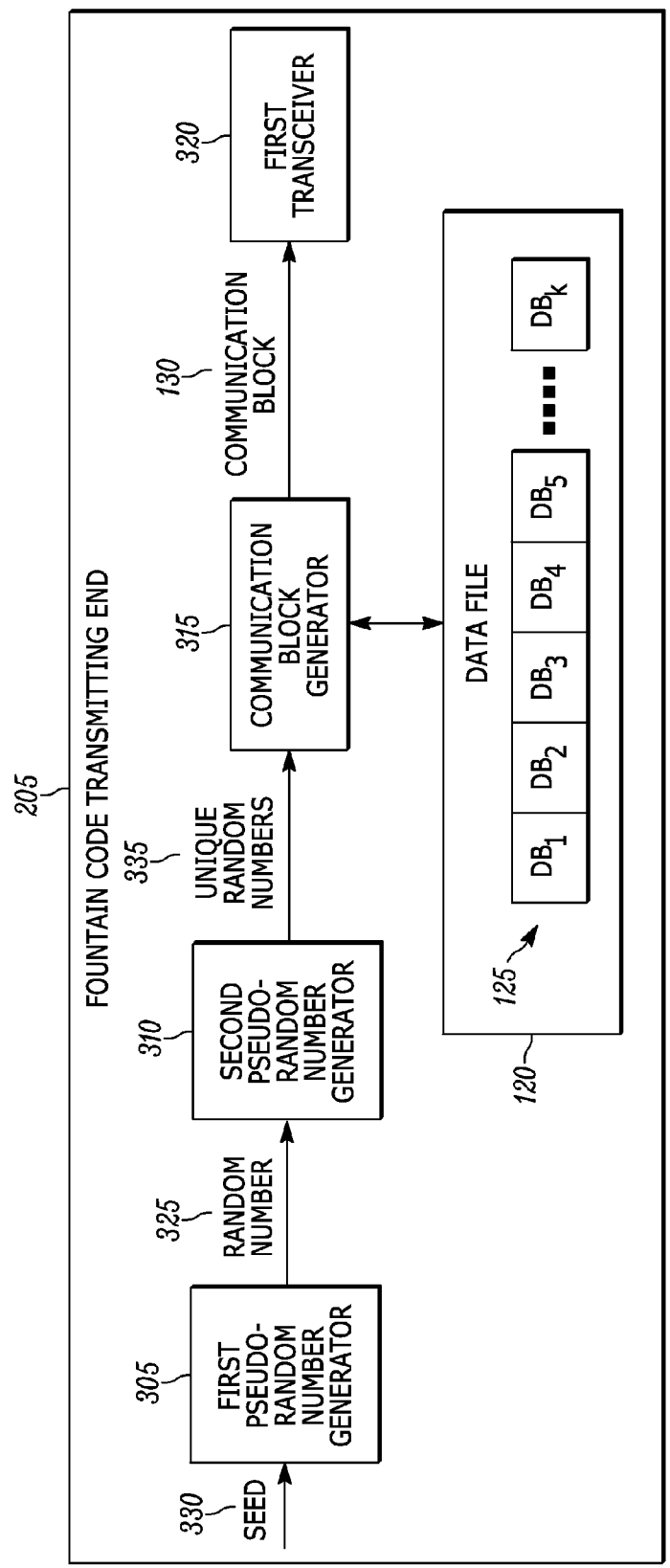
FIG. 3 is a block diagram of a fountain code transmitting end, in accordance with some embodiments.

FIG. 3 is a fountain code transmitting end 205, in accordance with some embodiments. In the embodiment illustrated in FIG. 3, the fountain code transmitting end 205 includes, among other components, a first pseudorandom number generator 305, a second pseudorandom number generator 310, a communication block generator 315, a first transceiver 320, and the data file 120. The data file 120 includes a plurality of data blocks 125 (for example, k data blocks). In some embodiments, the first and second pseudorandom number generators 305 and 310 include linear-feedback shift registers with different feedback taps. A linear-feedback shift register is a shift register whose input bit is a linear function (for example, the XOR operation) of its previous state. An initial value of a linear-feedback shift register is called the seed. In alternative embodiments, the first and second pseudorandom number generators 305 and 310 include linear congruential generators with different encoding parameters. A linear congruential generator generates sequences of pseudorandomized numbers using a discontinuous piecewise linear equation. An initial value of the linear congruential generator is also called the seed.

The first pseudorandom number generator 305 generates one random number 325 for each communication block 130. The first pseudorandom number generator 305 generates a first random number for a first communication block based in part on a seed 330 (for example, an initial value). In some embodiments, the first pseudorandom number generator 305 generates each subsequent random number based at least in part on the previous random number generated by the first pseudorandom number generator 305. For example, the first pseudorandom number generator 305 generates a second random number for a second communication block based in part on the first random number.

The fountain code transmitting end 205 determines a degree d, $1 \leq d \leq k$ for each communication block 130 based at least in part on the random number 325 generated by the first pseudorandom number generator 305. The degree specifies a quantity of unique random numbers that need to be subsequently generated by the second pseudorandom number generator 310. In some embodiments, the degree for a communication block 130 is equal to the random number 325 generated by the first pseudorandom number generator 305 for that communication block 130. In alternative embodiments, the fountain code transmitting end 205 determines the degree for each communication block 130 using an inverse transform sampling algorithm. Inverse transform sampling algorithms generate random numbers from a specified probability distribution.

The second pseudorandom number generator 310 draws random numbers to generate a plurality of unique random numbers 335 (for example, d unique random numbers) for each communication block 130. The plurality of unique random numbers 335 for each communication block 130 includes a quantity of random numbers that is equal to the degree. As the degree varies for each communication block 130, each plurality of unique random numbers includes a different quantity of unique random numbers. For example, a first quantity of unique random numbers in a first plurality of unique random numbers for a first communication block is not equal a second quantity of unique random numbers in a second plurality of unique random numbers for a second communication block. In some embodiments, the quantity of unique random numbers in the plurality of unique random numbers 335 is equal to the random number 325 generated by the first pseudorandom number generator 305. For example, a first quantity of unique random numbers in a first plurality of unique random numbers is equal to a first random number, generated by the first pseudorandom number generator 305, for a first communication block. The second pseudorandom number generator 310 uses the random number 325, generated by the first pseudorandom number generator 305 for each communication block 130, as an initial seed to generate the plurality of unique random numbers 335. Note that the number of draws that the second pseudorandom number generator 310 makes for each communication block 130 can be greater than d in order to generate the d unique random numbers. For example, to account for possible duplicate random numbers, the second pseudorandom number generator 310 may draw more than thirty-two random numbers when the degree is thirty-two.

The communication block generator 315 generates each communication block 130 based on the plurality of unique random numbers 335 generated by the second pseudorandom number generator 310. Each communication block 130 includes, but is not limited to, a unique combination of multiple data blocks 125 from the data file 120. Each of the plurality of unique random numbers 335 corresponds to a specific data block in the data file 120. For example, a unique random number of two corresponds to a second data block in the data file 120 and a unique random number of fourteen correspond to the fourteenth data block in the data file 120. The communication block generator 315 selects a subset of data blocks from the data file 120 for each communication block 130 based on the plurality of unique random numbers 335 generated by the second pseudorandom number generator 310. For example, a first subset of data blocks for a first communication block includes the second and fifth data blocks in the data file 120 when a first plurality of unique numbers includes two and five. The communication block generator 315 generates each communication block 130 based on the selected subset of data blocks. In some embodiments, the communication block generator 315 generates each communication block 130 by combining (for example, using the bitwise XOR function) the data blocks 125 included in the selected subset of data blocks.

The first transceiver 320 transmits each communication block 130 generated by the fountain code transmitting end 205. In some embodiments, the first transceiver 320 transmits the seed 330 along with the first communication block.

Figure 4:
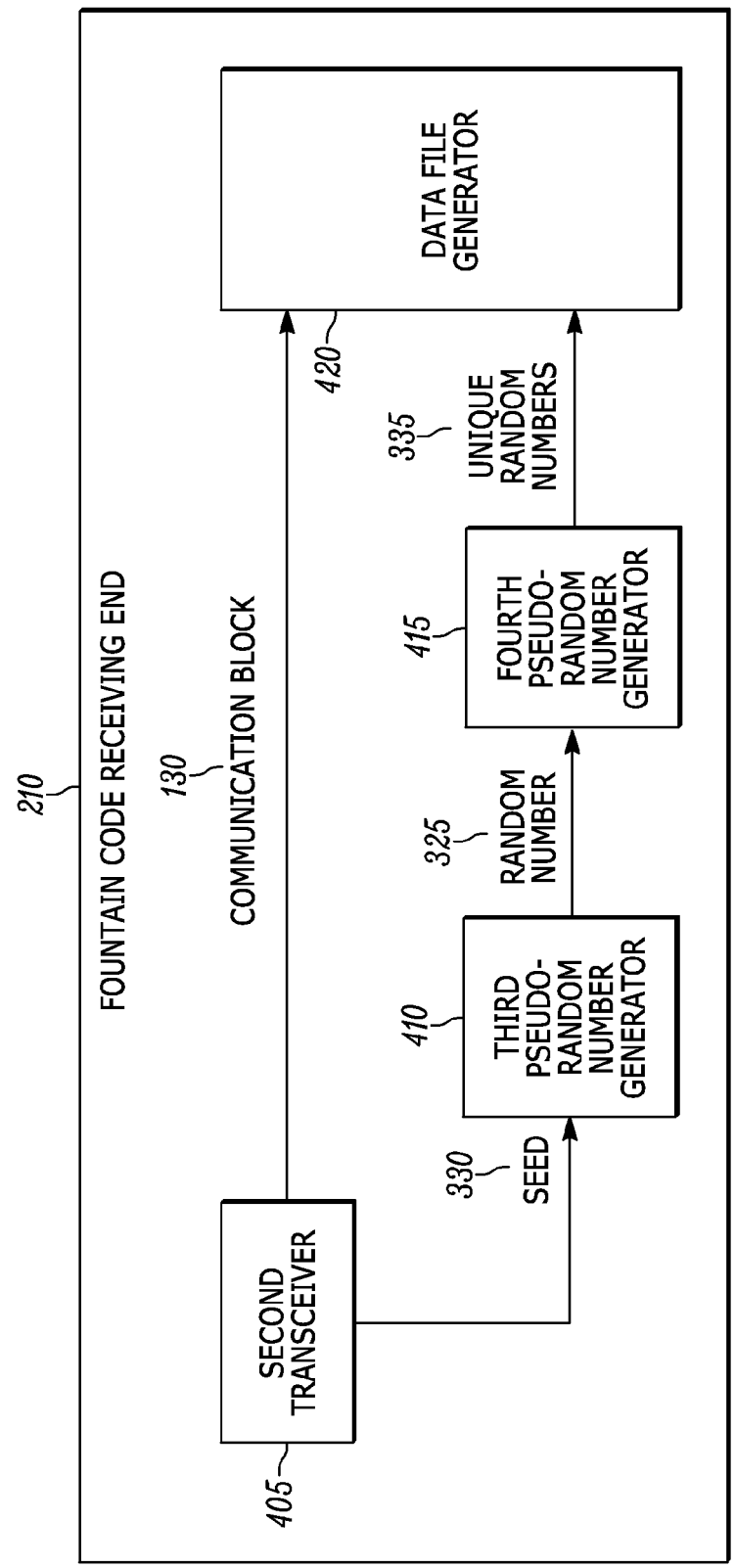
FIG. 4 is a block diagram of a fountain code receiving end, in accordance with some embodiments.

FIG. 4 is a fountain code receiving end 210, in accordance with some embodiments. In the embodiment illustrated in FIG. 4, the fountain code receiving end 210 includes, among other components, a second transceiver 405, a third pseudorandom number generator 410, a fourth pseudo-random number generator 415, and a data file generator 420. In some embodiments, the third pseudorandom number generator 410 includes a linear-feedback shift register with the same feedback tap as used in the first pseudorandom number generator 305, and the fourth pseudorandom number generator 415 includes a linear-feedback shift register with the same feedback tap as used in the second pseudorandom number generator 310. In alternative embodiments, the third pseudorandom number generator 410 includes a linear congruential generator with the same encoding parameters as used in the first pseudorandom number generator 305, and the fourth pseudorandom number generator 415 includes a linear congruential generator with the same encoding parameters as used in the second pseudorandom number generator 310.

The second transceiver 405 receives communication block 130 (for example, from the first transceiver 320). In some embodiments, the second transceiver 405 also receives the seed 330 along with the first communication block. The fountain code receiving end 210 determines the validity of each received communication block 130. Errored communication blocks are detected via an error checking mechanism such as a cyclic redundancy check and discarded. In addition, the fountain code receiving end 210 detects missed communication blocks. For example, the fountain code receiving end 210 detects a missed communication block when a threshold amount of time elapses after the second transceiver 405 received the previous communication block.

The third pseudorandom number generator 410 generates one random number 325 for each communication block 130 either missed, or received by the second transceiver 405, regardless of their validity. The third pseudorandom number generator 410 generates the first random number for the first communication block based in part on the seed 330. In some embodiments, the third pseudorandom number generator 410 generates each subsequent random number based at least in part on the previous random number generated by the third pseudorandom number generator 410. For example, the third pseudorandom number generator 410 generates the second random number for the second communication block based in part on the first random number. This enables the third pseudorandom number generator 410 to maintain synchronization with the first pseudorandom number generator 305.

The fountain code receiving end 210 determines a degree d for each communication block 130 based at least in part on the random number 325 generated by the third pseudorandom number generator 410. The degree specifies the number of unique random numbers that need to be subsequently generated by the fourth pseudorandom number generator 415. In some embodiments, the degree for a communication block 130 is equal to the random number 325 generated by the third pseudorandom number generator 410 for that communication block 130. In alternative embodiments, the fountain code receiving end 210 determines the degree for each communication block 130 using an inverse transform sampling algorithm.

The fourth pseudorandom number generator 415 draws random numbers to generate the plurality of unique random numbers 335 (for example, d unique random numbers) for each communication block 130 received by the second transceiver 405. The fourth pseudorandom number generator 415 uses the random number 325, generated by the third pseudorandom number generator 410 for each communication block 130 received by the second transceiver 405, as an initial seed value to generate the plurality of unique random numbers 335. Note that the number of draws that the fourth pseudorandom number generator 415 makes for each plurality of unique random numbers 335 can be greater than d in order to generate the d unique random numbers. In some embodiments, the fourth pseudorandom number generator 415 generates the plurality of unique random numbers 335 only when the second transceiver 405 receives a valid communication block. In some embodiments, the fourth pseudorandom number generator 415 does not generate the plurality of unique random numbers 335 when the second transceiver 405 receives an errored communication block 130. In some embodiments, the fourth pseudorandom number generator 415 does not generate the plurality of unique random numbers 335 for a missed communication block despite the fact that the third pseudorandom number generator 410 generates the random number 325 for the missed communication block.

The data file generator 420 identifies the subset of data blocks included in each valid communication block, received by the second transceiver 405, based in part on the plurality of unique random numbers 335, generated by the fourth pseudorandom number generator 415. For example, when the plurality of unique random numbers 335 for a communication block 130 includes two, five, and seventeen, the data file generator 430 identifies that the communication block 130 includes the second, fifth, and seventeenth data block from the data file 120. Eventually, the data file generator 420 receives enough information (for example, from valid communication blocks received by the second transceiver 405) to decode the data blocks 130 thus reconstructing the data file 120.

Figure 5:
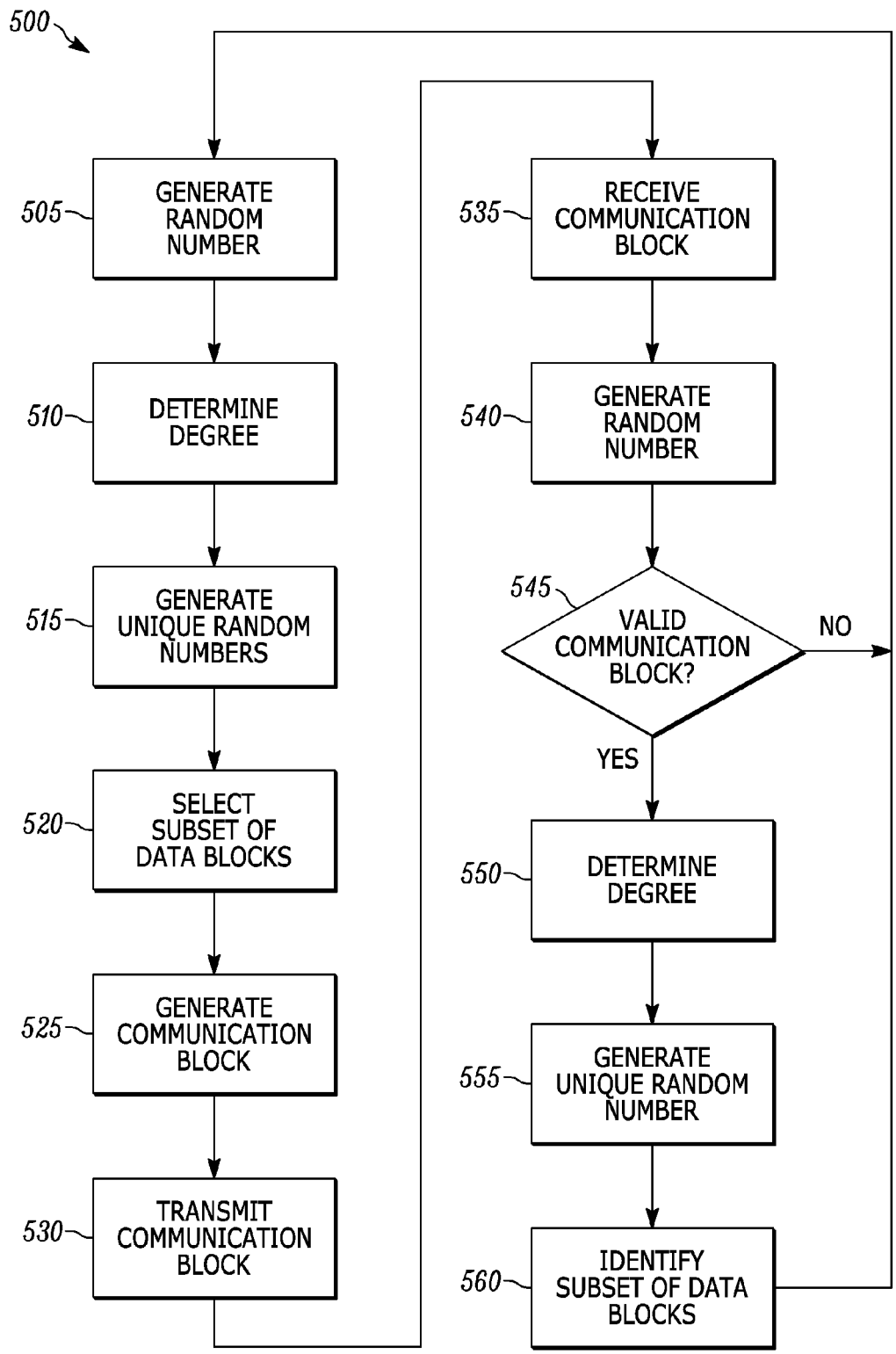
FIG. 5 is a flowchart of synchronizing a fountain code transmitting end and receiving end.

FIG. 5 is a method 500 (or process) of synchronizing a fountain code transmitting end and receiving end 205 and 210. In block 505, the fountain code transmitting end 205 generates, for example, using the first pseudorandom number generator 305, the random number 325 based at least in part on the seed 330. In block 510, the fountain code transmitting end 205 determines a degree d based at least in part on the random number 325. In block 515, the fountain code transmitting end 205 generates, for example, using the second pseudorandom number generator 310, the plurality of unique random numbers 335 based at least in part on the random number 325. In block 520, the fountain code transmitting end 205 selects, for example, using the communication block generator 315, a subset of data blocks from the data file 120 based on the plurality of unique random numbers 335. In block 525, the fountain code transmitting end 205 generates, for example, using the communication block generator 315, a communication block 130 based at least in part on the subset of data blocks. In block 530, the fountain code transmitting end 205 transmits the communication block 130, for example, using the first transceiver 320. In the embodiment illustrated, the method 500 proceeds to block 535 after block 530. In some embodiments, the method 500 returns to block 505 to generate a new communication block 130 after block 530.

In block 535, the fountain code receiving end 210 receives the communication block 130, for example, using the second transceiver 405. In block 540, the fountain code receiving end 210 generates, for example, using the third pseudorandom number generator 410, the random number 325 based at least in part on the seed 330. In block 545, the fountain code receiving end 210 determines whether the received communication block 130 is valid via verifying the error checking mechanism (for example, as a cyclic redundancy check). In the embodiment illustrated the method 500 returns to block 505 to generate a new communication block 130 when the received communication block 130 is found to be invalid. In alternate embodiments, the method 500 returns to block 535 to receive a new communication block 130 when the received communication block 130 is found to be invalid (not shown). Alternatively, the fountain code receiving end 210 determines the degree d based at least in part on the random number 325 when the received communication block 130 is valid (block 550). In block 555, the fountain code receiving end 210 generates, for example, using the fourth pseudorandom number generator 415, the plurality of unique random numbers 335. In block 560, the fountain code receiving end 210 identifies, for example, using the data file generator 420, the subset of data blocks included in the received communication block 130 based in part on the plurality of unique random numbers 335. In the embodiment illustrated, the method 500 returns to block 505 to generate a new communication block 130 after block 560. In alternate embodiments, the method returns to block 535 to receive a new communication block 130 after block 560 (not shown).

In some embodiments, blocks 505 through 530 and blocks 535 through 560 are performed in parallel. For example, the fountain code transmitting end 205 performs blocks 505 through 530 and the fountain code receiving end 210 performs blocks 535 through 560.

Figure 6:
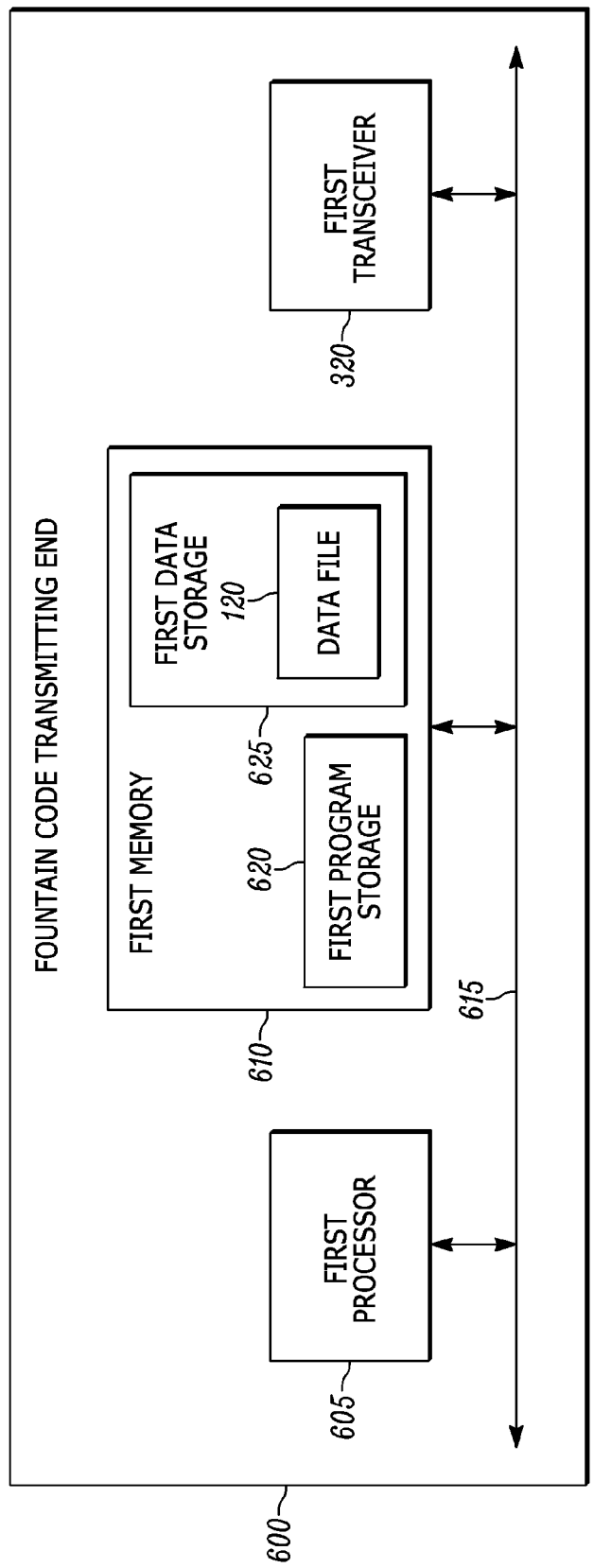
FIG. 6 is a block diagram of a fountain code transmitting end, in accordance with some embodiments.

FIG. 6 is a fountain code transmitting end 600, in accordance with some embodiments. In the embodiment illustrated in FIG. 6, the fountain code transmitting end 600 includes, among other components, a first processor 605 (for example, a microprocessor, a microcontroller, or another suitable programmable device), a first memory 610, and the first transceiver 320. The first processor 605, the first memory 610, and the first transceiver 320 are communicably coupled with one another via a first system bus 615.

The first memory 610 includes, for example, a first program storage 620 and a first data storage 625. In some embodiments, the data file 120 is stored within the first data storage 625. The first program storage 620 and the first data storage 625 can include combinations of different types of memory, such as read only memory (ROM), random access memory (RAM) (for example, dynamic RAM [DRAM], synchronous DRAM [SDRAM], etc.), electrically erasable programmable read only memory (EEPROM), flash memory, a hard disk, an SD card, or other suitable magnetic, optical, physical, or electronic memory devices or data structures. The first processor 605 is connected to the first memory 610 and executes software instructions that are capable of being stored in a RAM of the memory first 610 (for example, during execution), a ROM of the memory first 610 (for example, on a generally permanent basis), or another non-transitory computer readable medium such as another memory or a disc. Software included in some embodiments of the fountain code transmitting end 600 can be stored in the first memory 610. The software includes, for example, firmware, one or more applications, program data, filters, rules, one or more program modules, and other executable instructions. The first processor 605 is configured to retrieve from the first memory 610 and execute, among other things, instructions related to the control processes and methods described herein.

The first transceiver 320 sends and/or receives signals to and/or from one or more separate transceivers (for example, the second transceiver 405). Signals include, among other components, communication blocks 130, seeds 330, information, data, serial data, and data packets. The first transceiver 320 can be coupled to one or more separate transceivers via, for example, wired connections, fiber optic connections, and/or a wireless connections. Wireless communication can be implemented using various wireless network topologies known to those skilled in the art, including for example, two-way digital radio topologies, cellular topologies, and others. Communication via wired and/or fiber optic connections can be implemented using various appropriate network topologies including networks using, for example, Ethernet or similar protocols.

Figure 7:
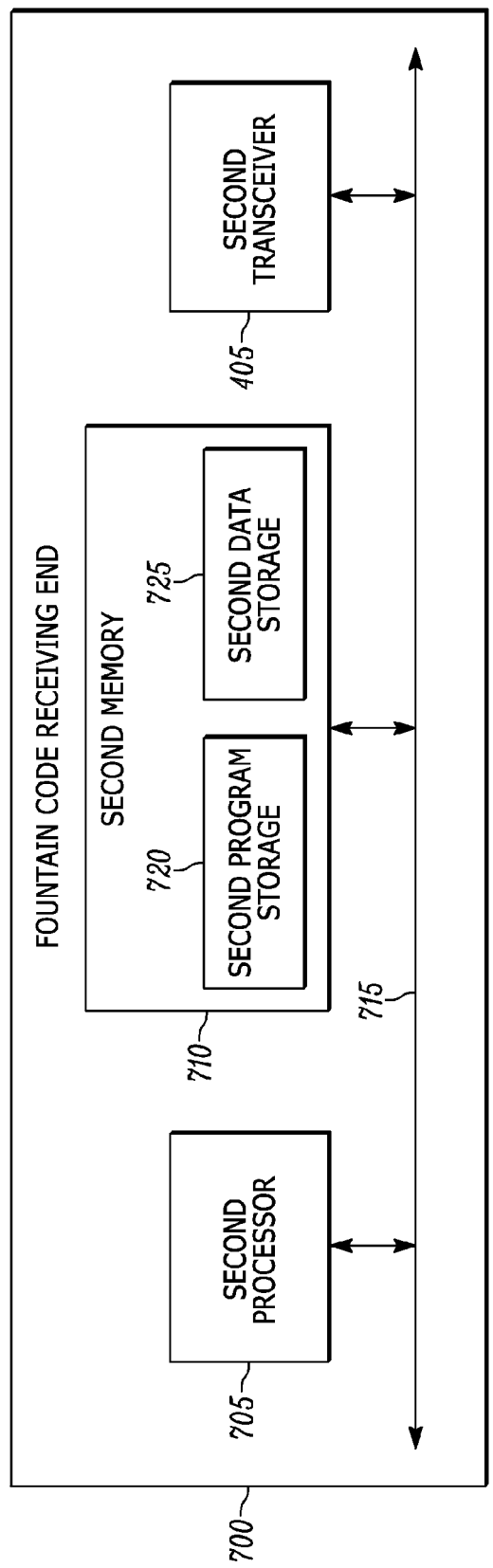
FIG. 7 is a block diagram of a fountain code receiving end, in accordance with some embodiments.

FIG. 7 illustrates a fountain code receiving end 700, in accordance with some embodiments. In the embodiment illustrated, the fountain code receiving end 700 includes, among other components, a second processor 705 (for example, a microprocessor, a microcontroller, or another suitable programmable device), a second memory 710, and the second transceiver 405. The second processor 705, the second memory 710, and the second transceiver 405 are communicably coupled with one another via a second system bus 715.

The second memory 710 includes, for example, a second program storage 720 and a second data storage 725. The second program storage 720 and the second data storage 725 can include combinations of different types of memory, such as read only memory (ROM), random access memory (RAM) (for example, dynamic RAM [DRAM], synchronous DRAM [SDRAM], etc.), electrically erasable programmable read only memory (EEPROM), flash memory, a hard disk, an SD card, or other suitable magnetic, optical, physical, or electronic memory devices or data structures. The second processor 705 is connected to the second memory 710 and executes software instructions that are capable of being stored in a RAM of the second memory 710 (for example, during execution), a ROM of the second memory 710 (for example, on a generally permanent basis), or another non-transitory computer readable medium such as another memory or a disc. Software included in some embodiments of the fountain code receiving end 700 can be stored in the second memory 710. The software includes, for example, firmware, one or more applications, program data, filters, rules, one or more program modules, and other executable instructions. The second processor 705 is configured to retrieve from the second memory 710 and execute, among other things, instructions related to the control processes and methods described herein.

The second transceiver 405 sends and/or receives signals to and/or from one or more separate transceivers (for example, the first transceiver 320). Signals include, among other components, communication blocks 130, seeds 330, information, data, serial data, and data packets. The second transceiver 405 can be coupled to one or more separate transceivers via wired connections, fiber optic connections, and/or a wireless connections. The various communication protocols, networks, and connections described above may be utilized.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A method of synchronizing a fountain code transmitting end and a fountain code receiving end, the fountain code transmitting end including a first pseudorandom number generator, a second pseudorandom number generator, and a first transceiver, the method comprising:
generating, at the first pseudorandom number generator, a first random number based on a seed;
generating, at the second pseudorandom number generator, a first plurality of unique random numbers based on the first random number;
selecting, at the fountain code transmitting end, a first subset of data blocks of a plurality of data blocks based on the first plurality of unique random numbers;
generating, at the fountain code transmitting end, a first communication block based on the first subset of data blocks; and
transmitting, via the first transceiver, the first communication block and the seed.

2. The method of claim 1, further comprises utilizing, in the second pseudorandom number generator, the first random number as an initial seed to generate the first plurality of unique random numbers.

3. The method of claim 1, wherein the first plurality of unique random numbers includes a first quantity of unique random numbers, wherein the first quantity of unique random numbers is equal to the first random number.

4. The method of claim 1, further comprises determining, at the fountain code transmitting end, a degree based on the first random number, wherein the first plurality of unique random numbers includes a first quantity of unique random numbers, wherein the first quantity of unique random numbers is equal to the degree.

5. The method of claim 4, further comprises performing, at the fountain code transmitting end, an inverse transform sampling algorithm to determine to the degree.

6. The method of claim 1, wherein each of the first plurality of unique random numbers corresponds to a specific data block of the plurality of data blocks.

7. The method of claim 1, wherein the fountain code receiving end includes a third pseudorandom number generator, a fourth pseudorandom number generator, and a second transceiver, wherein the method further comprises:
receiving, via the second transceiver, the first communication block and the seed;
generating, at the third pseudorandom number generator, the first random number based on the seed;
generating, at the fourth pseudorandom number generator, the first plurality of unique random numbers based on the first random number; and
identifying, at the fountain code receiving end, the first subset of data blocks included in the first communication block based on the first plurality of unique random numbers.

8. The method of claim 7, further comprising:
generating, at the first pseudorandom number generator, a second random number based on the first random number;
generating, at the second pseudorandom number generator, a second plurality of unique random numbers based on the second random number;
selecting, at the fountain code transmitting end, a second subset of data blocks of the plurality of data blocks based on the second plurality of unique random numbers;
generating, at the fountain code transmitting end, a second communication block based on the second subset of data blocks; and
transmitting, via the first transceiver, the second communication block.

9. The method of claim 8, further comprising:
receiving, via the second transceiver, the second communication block;
generating, at the third pseudorandom number generator, the second random number based on the first random number;
generating, at the fourth pseudorandom number generator, the second plurality of unique random numbers based on the second random number; and
identifying, at the fountain code receiving end, the second subset of data blocks included in the second communication block based on the second plurality of unique random numbers.

10. The method of claim 9, wherein the first plurality of unique random numbers includes a first quantity of unique random numbers, wherein the second plurality of unique random numbers includes a second quantity of unique random numbers, wherein the second quantity of unique random numbers is not equal to the first quantity of unique random numbers.

11. A fountain code system for communicating a data file, the data file including a plurality of data blocks, the fountain code system comprising:
a fountain code transmitting end including:
a first pseudorandom number generator that generates a first random number based on a seed,
a second pseudorandom number generator that generates a first plurality of unique random numbers based on the first random number, and
a first transceiver that transmits a first communication block and the seed,
wherein the fountain code transmitting end:
selects a first subset of data blocks of the plurality of data blocks based on the first plurality of unique random numbers, and
generates the first communication block based on the first subset of data blocks.

12. The fountain code system of claim 11, wherein the second pseudorandom number generator uses the first random number as an initial seed to generate the first plurality of unique random numbers.

13. The fountain code system of claim 11, wherein the first plurality of unique random numbers includes a first quantity of unique random numbers, and wherein the first quantity of unique random numbers is equal to the first random number.

14. The fountain code system of claim 11, wherein the fountain code transmitting end determines a degree based on the first random number, wherein the first plurality of unique random numbers includes a first quantity of unique random numbers, and wherein the first quantity of unique random numbers that is equal to the degree.

15. The fountain code system of claim 14, wherein the fountain code transmitting end uses an inverse transform sampling algorithm to determine the degree.

16. The fountain code system of claim 11, wherein the first pseudorandom number generator includes one selected from a group consisting of a linear-feedback shift register and a linear congruential generator.

17. The fountain code system of claim 11, further comprises:
a fountain code receiving end including:
  a second transceiver that receives the first communication block and the seed,
  a third pseudorandom number generator that generates the first random number based on the seed, and
  a fourth pseudorandom number generator that generates the first plurality of unique random numbers based on the first random number,
wherein the fountain code receiving end identifies the first subset of data blocks included in the first communication block based on the first plurality of unique random numbers.

18. The fountain code system of claim 17,
wherein the first pseudorandom number generator generates a second random number based on the first random number,
wherein the second pseudorandom number generator generates a second plurality of unique random numbers based on the second random number,
wherein the fountain code transmitting end selects a second subset of data blocks of the plurality of data blocks based on the second plurality of unique random numbers,
wherein the fountain code transmitting end generates a second communication block based on the second subset of data blocks, and
wherein the first transceiver transmits the second communication block.

19. The fountain code system of claim 18,
wherein the second transceiver receives the second communication block,
wherein the third pseudorandom number generator generates the second random number based on the first random number,
wherein the fourth pseudorandom number generator generates the second plurality of unique random numbers based on the second random number,
wherein the fountain code receiving end identifies the second subset of data blocks included in the second communication block based on the second plurality of unique random numbers.

20. The fountain code system of claim 19, wherein the first plurality of unique random numbers includes a first quantity of unique random numbers, wherein the second plurality of unique random numbers includes a second quantity of unique random numbers, wherein the second quantity of unique random numbers is not equal to the first quantity of unique random numbers.

* * * * *